(12) United States Patent
Fechtel

(10) Patent No.: US 7,539,268 B2
(45) Date of Patent: May 26, 2009

(54) TRANSMISSION/RECEPTION ARRANGEMENT AND METHOD FOR REDUCING NONLINEARITIES IN OUTPUT SIGNALS FROM A TRANSMISSION/RECEPTION ARRANGEMENT

(75) Inventor: Stefan Fechtel, München (DE)

(73) Assignee: Infineon Technologies AG, Munich (DE)

( * ) Notice: Subject to any disclaimer, the term of this patent is extended or adjusted under 35 U.S.C. 154(b) by 551 days.

(21) Appl. No.: 11/049,258

(22) Filed: Feb. 2, 2005

(65) Prior Publication Data

US 2006/0034356 A1 Feb. 16, 2006

(30) Foreign Application Priority Data

Feb. 2, 2004 (DE) ................. 10 2004 005 130

(51) Int. Cl.
*H04L 25/49* (2006.01)
*H04B 17/02* (2006.01)

(52) U.S. Cl. .................... 375/296; 375/213

(58) Field of Classification Search ........... 375/259, 375/260, 285, 284, 279, 271, 295–297, 316, 375/317, 319, 322, 324, 326, 340, 346, 349, 375/350, 213, 219, 224–228; 455/39, 63.1, 455/91, 114.3, 114.2, 73, 115.1, 423, 115.2, 455/115.3, 115.4, 67.11, 67.13, 67.14, 114.1; 702/85, 86, 108, 127; 708/85, 86, 108, 127
See application file for complete search history.

(56) References Cited

U.S. PATENT DOCUMENTS

| | | | | |
|---|---|---|---|---|
| 4,015,262 A | * | 3/1977 | Etcheverry et al. .......... 342/396 |
| 4,106,102 A | * | 8/1978 | Desblache .................. 708/310 |
| 5,381,108 A | * | 1/1995 | Whitmarsh et al. ............ 330/2 |
| 5,396,190 A | | 3/1995 | Murata |
| 5,644,596 A | * | 7/1997 | Sih .............................. 375/232 |
| 5,990,738 A | * | 11/1999 | Wright et al. ................ 330/149 |
| 6,147,553 A | | 11/2000 | Kolanek |
| 6,363,262 B1 | * | 3/2002 | McNicol ..................... 455/561 |
| 6,429,738 B1 | * | 8/2002 | Kenington ................... 330/52 |
| 6,670,900 B1 | * | 12/2003 | Zhang ......................... 341/118 |
| 6,934,341 B2 | * | 8/2005 | Sahlman ...................... 375/297 |
| 7,130,589 B2 | * | 10/2006 | Lee et al. .................. 455/67.11 |
| 7,187,916 B2 | * | 3/2007 | Mo et al. .................... 455/323 |
| 2003/0223480 A1 | * | 12/2003 | Cafarella ..................... 375/219 |
| 2004/0038649 A1 | * | 2/2004 | Lin et al. ..................... 455/130 |
| 2004/0087279 A1 | * | 5/2004 | Muschallik et al. ........... 455/73 |

OTHER PUBLICATIONS

"PMB 8680 Dual-Bank WLAN RF Transceiver—Wireless Components", Preliminary Specification, Version 0.95, Apr. 2003, 54 pgs.

* cited by examiner

*Primary Examiner*—Mohammad H Ghayour
*Assistant Examiner*—Vineeta S Panwalkar
(74) *Attorney, Agent, or Firm*—Eschweiler & Associates, LLC

(57) ABSTRACT

The invention proposes a transmission/reception arrangement (1) which contains a respective distortion unit (5, 6) for the transmission and reception paths (2, 3) and also a calibration apparatus (7). By sending a test signal in an operating mode for calibration and returning the test signal processed in the transmission path (2) to the reception path, it is possible to evaluate the error signals in the transmission and reception paths. In line with the principle proposed, this is done by evaluating the spectral components of the returned received signal which each represent single sources of error in the transmission or reception path. This allows calculation of calibration parameters for suppressing these errors both in the transmission path and in the reception path.

11 Claims, 3 Drawing Sheets

TRANSMISSION/RECEPTION ARRANGEMENT AND METHOD FOR REDUCING NONLINEARITIES IN OUTPUT SIGNALS FROM A TRANSMISSION/RECEPTION ARRANGEMENT

REFERENCE TO RELATED APPLICATIONS

This application claims the benefit of the priority date of German application DE 10 2004 005 130.5, filed on Feb. 2, 2004, the contents of which are herein incorporated by reference in their entirety.

FIELD OF THE INVENTION

The invention relates to a transmission/reception arrangement and to a method for reducing nonlinearities in the output signal from a transmission/reception arrangement.

BACKGROUND OF THE INVENTION

Transmission/reception circuits for digital communication are frequently implemented using the direct mixer principle. In this case, the complex-value baseband signal comprising an inphase component and a quadrature component is converted directly to the RF transmission frequency in the transmission path. In the reception path, a received RF signal is downconverted directly to the center frequency 0, is split into the inphase and quadrature components and is processed further.

The great demands on the signal quality of high-quality modulation types such as 16 or 64 QAM (Quadrature Amplitude Modulation), which are demanded for WLAN (Wireless LAN), for example, mean that nonlinear characteristics for the RF components, particularly the mixers, amplifiers and the filter stages in the transmission and reception paths, can have a particularly disruptive effect. The nonlinearities appear in the form of an amplitude or phase error, which is generally referred to as an IQ mismatch. The IQ mismatch manifests itself at the transmission end and the reception end by impairing the signal-to-noise ratio or by increasing a vector error at the IQ level, this being referred to as the "Error Vector Magnitude (EVM)".

An additional, unwanted DC component, the DC offset, produces a signal in the transmission path at the carrier frequency, which is usually situated centrally in the useful signal range. A DC component in the reception path likewise results in a signal close to the center frequency 0.

During production, either calibration to correct the sources of error is performed directly on the RF components or digital compensating circuits, referred to as predistorters, are used which compensate for any amplitude or phase error which arises and for a DC component by adding an additional signal to the useful signal or altering the useful signal. Fluctuations in the errors during the product lifecycle as a result of aging and during ongoing operation as a result of changes in the temperature are not compensated for by fixed presets, however.

The inventor is aware of a method for compensating for an IQ mismatch and a DC component in the transmission path of a transmission and reception stage. In this case, the powers of the parasitic signals of the IQ mismatch and of the DC component are gauged in the transmission path. This can be done by determining distortions in the output signal from the transmission path, for example. A transmission arrangement which is suitable for this purpose is known from the printed document U.S. Pat. No. 5,396,190. This document describes the practice of demodulating the distorted output signal again and ascertaining correction coefficients therefrom in a suitable fashion.

Printed document U.S. Pat. No. 6,147,553 shows a transmission path having a plurality of amplifier chains which are arranged in parallel and which each have compensating circuits connected upstream of them in order to perform amplitude and phase distortion for each amplifier chain. Errors which arise in the reception path of a transceiver, however, are not eliminated thereby.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention provides a transmission/reception arrangement which allows calibration to avoid an IQ mismatch and/or a DC component both in the transmission path and in the reception path. The present invention also provides a method for reducing the nonlinearities in the output signals from the transmission/reception arrangement, which is used in simple fashion to calibrate both the transmission path and the reception path and prevent an IQ mismatch or DC signal component.

In accordance with one aspect of the invention, a transmission/reception arrangement comprises an input, an output, a transmission output and a reception input. A transmission path within the transmission and reception arrangement is designed to convert a discrete-value transmission signal applied to the input into an analog transmission signal and to output it to the transmission output. A reception path within the transmission/reception arrangement is designed to output a discrete-value received signal, converted from an analog signal applied to the reception input, having a first and a second component to its output. In addition, the transmission/reception arrangement comprises a switchable connection between the output of the transmission path and the input of the reception path. A first compensation device, connected upstream of the transmission path, having a control input and a signal input for a discrete-value signal comprising a first and a second component is coupled to the input of the transmission path. The first compensation device is designed to distort a first and a second component of a discrete-value signal and to output the distorted discrete-value signal to the output. The transmission/reception arrangement contains a second compensation device, connected downstream of the reception path, having a control input and an output for a discrete-value signal comprising a first and a second component. The second compensation device is likewise designed to alter the discrete-value received signal and to output an altered signal to the output. In addition, the transmission and reception arrangement comprises a first switching arrangement having a first and a second adoptable state, whose output is connected to the input of the first compensation device and which, in the first state, connects the input of the first compensation device to the input of the transmission/reception arrangement, and, in the second state, connects the input of the first compensation device to an output for a controllable generator circuit producing a discrete-value test signal. In addition, a second switching device having a first and a second adoptable state is provided which is connected to the output of the second compensation device and which, in the first state, connects the output of the first compensation device to the output of the transmission/reception arrangement, and, in the second state, connects the output of the first compensation device to an input on a measuring apparatus. The measuring apparatus is designed to output an evaluation signal from a discrete-value signal applied to its input. Finally, the inventive transmission/reception arrangement comprises a calibration apparatus for controlling the first and second switching devices of the generator circuit and the first switchable connection. In addition, the calibration apparatus has an input connected to the output of the measuring apparatus and is designed to control the alteration of the first and second compensation devices on the basis of an evaluation signal applied to the input.

In accordance with another aspect of the present invention, a transmission/reception arrangement contains a compensation device, such as in the form of a digital distorter, connected both upstream of the transmission path and downstream of the reception path. The device compensates for any nonlinearities which arise. This is done for the transmission path by predistorting a digital signal using the first compensation device such that the distortions which have arisen in the transmission path as a result of components which have a nonlinear transfer characteristic are compensated for by the predistortion of the first compensation device. At the same time, the second compensation device distorts a signal distorted by nonlinearities in the reception path such that the distortions which have arisen as a result of the reception path have disappeared again downstream of the second compensation device.

Calibration without additional external auxiliary means is possible on account of the test signal generator which is provided and the measuring apparatus with the inventive calibration apparatus.

The transmission/reception arrangement thus contains a first and a second operating state. In the first operating state, the transmission/reception arrangement is designed to output a transmission signal from a discrete-value signal to the transmission output. At the same time it is designed to convert a signal applied to the reception input into a discrete-value signal at the output of the transmission/reception arrangement. It therefore operates in a duplex mode.

In the second operating state, the transmission/reception arrangement is designed to output a test signal to the transmission path and to return a test signal converted in the transmission path to the input of the reception path. In the second operating state, the reception path is designed to output a signal applied to the reception side to a measuring apparatus which produces an evaluation signal for a calibration apparatus. The calibration apparatus uses the evaluation signal and the known test signal to ascertain the parameters required for the compensation, and sends these parameters to a first or second compensation device.

In another aspect of the present invention, the transmission path comprises a first mixing device having a local oscillator input for a first local oscillator signal at a first frequency, and the reception path comprises a second mixing device having a local oscillator input for a second local oscillator signal at a second frequency. Preferably, the first and second frequencies are different from one another. As a result, simultaneous measurement of an amplitude and phase error and of a DC component both for the transmission path and for the reception path is possible during the second operating state.

It can be expedient if the frequency of the first and the frequency of the second local oscillator signal can be set by the calibration apparatus. This makes it possible to compensate for any external interference signals which are coupled in and at the same time to test the entire transmission band for the distortion.

In this context, another aspect of the present invention involves the second local oscillator signal being formed by a frequency conversion device from the first local oscillator signal and an auxiliary signal. Hence, just one local oscillator is required, and the second local oscillator signal is formed from the first and the auxiliary signal when required. This is helpful when the frequency of the second local oscillator signal needs to be shifted, since this can be done by selecting the frequency of the auxiliary signal. In order to avoid overdriving the input of the reception path during a calibration operation, one advantageous development of the invention involves the switchable connection comprising an attenuation element for attenuating the analog transmission signal. It is expedient to provide attenuation elements having different attenuation in order to be able to calibrate the reception path with different input levels as a result.

In yet another aspect of the present invention, the first and second compensation devices contain a memory unit which can store parameters for altering the first and second components of the discrete-value signal or of the discrete-value received signal. In one refinement, these parameters are formed as a distortion matrix or as distortion parameters.

In another aspect of the present invention, a method for reducing nonlinearities in the output signal from a transmission/reception arrangement having a transmission path and a reception path is disclosed. A transmission/reception arrangement is provided. A discrete-value test signal is applied to an input on the transmission path. A frequency-converted, analog transmission signal derived from the discrete-value test signal is produced at an output on the transmission path. The transmission signal is returned to an input on the reception path. A frequency-converted, discrete-value received signal which is produced in the reception path and is derived from the returned transmission signal is evaluated in an evaluation device. Calibration parameters are provided for the transmission path and the reception path.

The return of the transmission signal to the reception path and the subsequent evaluation thus results in the distortions and nonlinearities which are present in the transmission path and in the reception path being ascertained by the evaluation device. It is therefore possible for calibration parameters for the transmission and reception paths to be provided after a single measurement.

In another aspect of the invention, producing a transmission signal contains or comprises converting the discrete-value test signal into an analog test signal, mixing the analog test signal with a first local oscillator signal at a variable first frequency and outputting the mixed test signal as the analog transmission signal.

The step of evaluating the received signal contains the steps of mixing the returned transmission signal with a second local oscillator signal at a variable second frequency and converting the mixed returned transmission signal into a discrete-value received signal. The two mixing operations with local oscillator signals at different frequencies separate existing amplitude and phase errors and also the DC components in the transmission and reception paths identifiably from one another. This makes it a particularly simple matter to identify the individual components and to provide appropriate calibration parameters for the individual causes of error.

In yet another aspect of the present invention, an evaluation is performed in the evaluation device by measuring a signal amplitude for the received signal as a function of a signal frequency for the received signal. Preferably, this is done by filtering the measurement signal. Alternatively, a signal phase for the received signal is additionally measured. As a result, the signal amplitude and also the signal phase are determined which provide information about amplitude and phase errors in the transmission and reception paths.

Since distortions in nonlinear components of the transmission and reception paths are usually dependent on the signal amplitude of a transmission signal or of a signal arriving in the reception path, the step of returning comprises attenuation of a signal level for the transmission signal, the step of producing and/or the step of evaluating comprises amplification of the transmission signal in the transmission path and amplification of the returned transmission signal in the reception path using a respective variable gain.

The calibration parameters can be calculated by calculating distortion coefficients from an amplitude and a phase for the discrete-value test signal and from an amplitude and a phase for the discrete-value evaluated signal. Predistortion coefficients can easily be produced from the calculated distortion coefficient.

In yet another aspect of the present invention, the step of providing calibration parameters comprises providing a distortion device for the transmission path and/or the reception path, respectively, and storing the calibration parameters for the transmission path and/or for the reception path in the distortion device. In addition, the step comprises use of the distortion device for the transmission path with the calibration parameters stored therein for distorting a signal applied to the input of the transmission path. In addition, the calibration parameters stored in the distortion device for the reception path can be used to distort the received signal which can be tapped off at the output of the reception path. This provides appropriate distortion for signals which are to be sent or signals which have been received after a calibration operation in line with the invention, so as to compensate for an IQ mismatch or DC signal components.

In an alternate aspect, the method is carried out a plurality of times by calibrating the first and second components separately.

BRIEF DESCRIPTION OF THE DRAWINGS

The invention will be explained in detail below using an exemplary embodiment with reference to the drawings, in which.

DETAILED DESCRIPTION OF THE INVENTION

Figure 1:
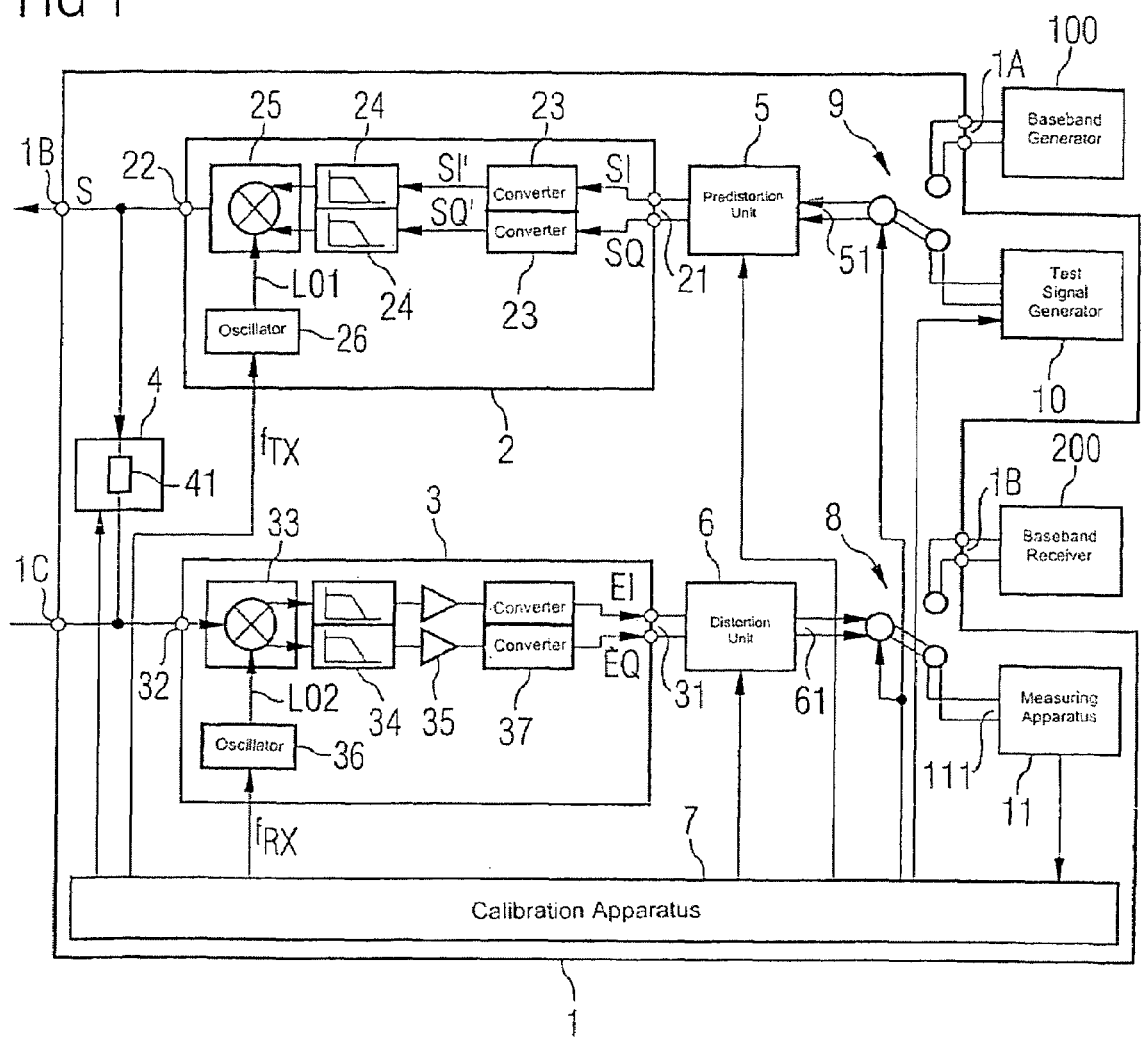
FIG. 1 shows an exemplary embodiment of a transmission/reception arrangement in accordance with an aspect of the present invention.

One or more implementations of the present invention will now be described with reference to the attached drawings, wherein like reference numerals are used to refer to like elements throughout, and wherein the illustrated structures are not necessarily drawn to scale.

FIG. 1 shows a block diagram of a transmission/reception arrangement in accordance with an aspect of the present invention. This arrangement has a signal input 1A for a complex-value digital baseband signal from the baseband generator 100. The complex-value baseband signal comprises a first digital component I, the "inphase" component, and a second digital component Q, the quadrature component. The baseband signal is therefore also referred to as an IQ signal.

The transmission/reception arrangement also contains a transmission output 1B and a reception input 1C. The transmission output 1B and the reception input 1C are designed for sending and receiving radio-frequency signals. Finally, the transmission/reception arrangement 1 comprises an output 1D for tapping off a complex-value discrete-value output signal having a component I and a component Q.

The input 1A of the transmission/reception arrangement 1 is connected to a switch 9 which, depending on its switch position, either connects the input 1A of the transmission/reception arrangement 1 to the input 51 of a predistortion unit 5 or connects the output of a generator circuit 10 to the input 51. The predistortion unit 5 is designed to predistort a signal applied to its input 51 with the parameters which are stored in the unit 5. In this case, the parameters may be real or else complex. It is thus possible to multiply the parameters, which are preferably stored in the form of a matrix, by the two components of the baseband signal.

In this case, the applied signal also contains the digital, i.e. discrete-value, inphase and quadrature components. The output of the predistortion unit 5 is connected to the input 21 of a transmission path 2. Said transmission path has its two connections for the inphase and quadrature components of the predistorted signal connected to two digital/analog converters 23. The digital/analog converters 23, which convert a discrete-value signal into a continuous transmission signal having the two components SI' and SQ', are connected to two low-pass filters 24. These are used to filter and suppress higher-frequency repetition spectra in the signal components on the basis of the digital/analog conversion.

The components filtered in this manner are supplied to an IQ modulator 25 which uses a local oscillator signal LO1 at a variable frequency from a local oscillator 26 to convert the baseband signal comprising the two components to the transmission signal and to output it at its output 22 as transmission signal S. This operation is referred to generally as analog mixing. The output 22 of the transmission path 2 is connected both to the output 1B of the transmission and reception arrangement and to a switchable connection 4.

The switchable connection 4, which for its part comprises a variable attenuation element 41, is connected to the reception input 1C of the transmission/reception arrangement and to an input 32 on a reception path 3. The input 32 of the reception path 3 is routed to an IQ demodulator or mixer 33 which is coupled to a local oscillator 36 by a local oscillator input. The IQ demodulator 33 converts a signal applied to the input 32 to a second frequency using a local oscillator signal and at the same time splits said signal into inphase and quadrature components I and Q.

Low-pass filters 34 connected to the two output connections of the mixer 33 suppress higher-frequency components and repetition spectra in the two components I and Q. Following amplification by the amplifiers 35, the received and converted signal is digitized in analog/digital converters 37 and is output at the output 31 as a signal comprising two digital components EI and EQ.

The output 31 of the reception path 3 is connected to an input on a distortion unit 6. This unit is designed to distort a signal applied to the input using distortion parameters which are stored in the unit 6 and to output the signal distorted in this manner at the output 61. The output 61 is connected to a switch 8 which, depending on its switching state, connects the output 61 to the output 1D or to an input 111 on a measuring apparatus 11.

In its simplest form, the measuring apparatus 11 evaluates the amplitude of signals applied to the input on the basis of frequency. To this end, it filters the unwanted signal components and then takes a power measurement. The measuring apparatus 11 sends the result to a calibration device 7 which uses it to calculate the IQ mismatch for the transmission path, and the reception path. In addition, the DC signal component is ascertained. The calibration device 7 firstly controls the switches 8 and 9, the switchable connection 4 and the local oscillators 26 and 36 to set the frequency of its local oscillator signals. In addition, it sends distortion parameters to the predistortion unit 5 and to the distortion unit 6.

A calibration operation is initialized via the calibration control device 7. This is done in the transceiver at particular times, for example upon turning on or else during ongoing operation, for example if the error rate of the data received exceeds a limit value. During ongoing operation, it is expedient for no transmission or reception to take place during the calibration. For the calibration, the calibration apparatus switches the switches 8 and 9 to the respective bottom switching setting and thus connects the test signal generator 10 to the predistortion unit 5 and the distortion unit 6 to the measuring apparatus 11. At the same time, the calibration device 7 switches the switchable connection 4 and selects an appropriate attenuation element, so that the input 32 of the reception path 3 is not overdriven.

In addition, the predistortion unit 5 and also the distortion unit 6 are switched such that signals applied to the input are not distorted, but rather are passed on in undistorted form. Finally, the calibration apparatus 7 uses two control signals $f_{TX}$ and $f_{RX}$ to the local oscillators 26 and 36 to determine the frequency of the local oscillator signal LO1 and the frequency of the local oscillator signal LO2. The signal generator 10 then produces a test signal. In the exemplary embodiment, the test generator produces a respective sinusoidal signal, in the form of digital values, for the inphase and quadrature components.

Figure 2A:
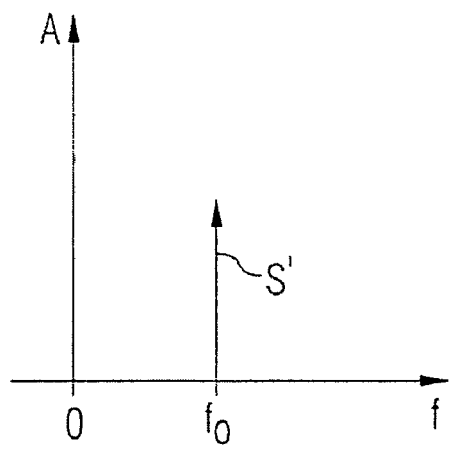
FIGS. 2A, 2B, and 2C show a spectrum of a test signal downstream of a transmission path or a reception path in accordance with an aspect of the present invention.
Figure 2B:
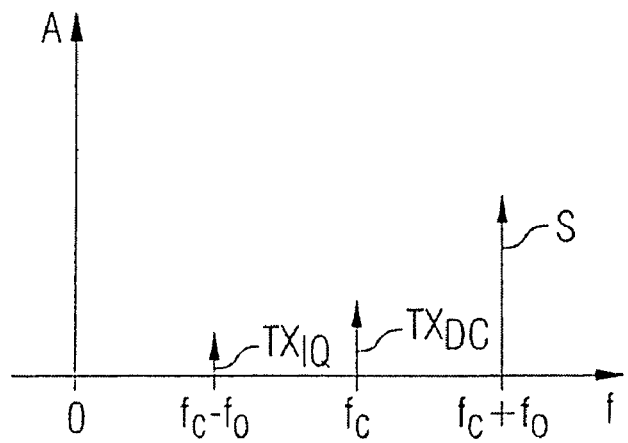

The spectrum of this signal S' is shown in FIG. 2A. The frequency of the signal in baseband is $f_0$. The signal is applied in undistorted form by the predistortion unit 5 with its components SI and SQ to the input 21 of the transmission path, is converted into an analog signal SI' and SQ' by the digital/analog converters 23, is filtered and is converted in the IQ modulator 25 into a transmission signal using the local oscillator signal LO1 at the frequency $f_C$. An illustrative spectrum can be seen in FIG. 2B.

The signal S at the frequency $f_C+f_0$ corresponds to the signal S which has been converted to the carrier frequency $f_C$ and which is applied to the input, and represents the useful signal. The signal $TX_{DC}$ at the frequency $f_C$ is a DC component, the DC offset within the transmission path 2, which results in a spectral component at the frequency $f_C$ as a result of the frequency conversion.

An additional amplitude or phase error (IQ mismatch) also produces a second sideband $TX_{IQ}$ at the frequency $f_C-f_0$. The respective amplitudes of the two error signals $TX_{DC}$ and $TX_{IQ}$ represent the relative level of the error. The DC signal component and also an existing IQ mismatch can thus easily be ascertained.

The overall signal comprising the three spectral components is reduced in amplitude via the switchable connection 4 and the attenuator contained therein and is supplied to the input 32 of the reception path. The mixer 33 for the reception path 3 converts the signal at the input 32 to a second frequency using the second local oscillator signal LO2.

Figure 2C:
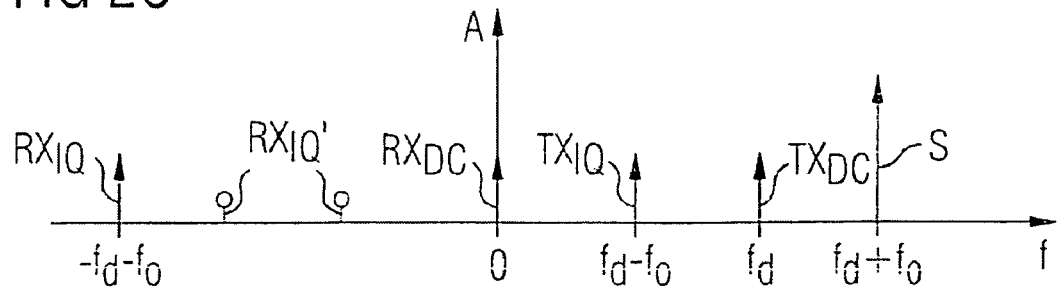

The frequency of the second local oscillator signal LO2 does not correspond to the carrier frequency $f_C$ of the first local oscillator signal LO1 in this case, but rather is shifted around it by a defined frequency $f_d$. Hence, $f_{LO2}=f_{LO1}+f_d=f_C+f_d$ is true. This results in the spectrum which can be seen in FIG. 2C. The signal S at the frequency $f_d+f_0$ is the actual test signal. The frequency shift between the first local oscillator signal LO1 at the frequency $f_C$ and the second local oscillator signal LO2 by the frequency $f_d$ means that the same signal component $TX_{DC}$ of the transmission path is now at the frequency $f_d$. The amplitude or phase error of the transmission path $TX_{IQ}$ is at the frequency $f_d-f_0$.

In addition, the frequency 0 produces a signal $RX_{DC}$, the cause of which is a DC component of the reception path, and an amplitude and phase error which results in the signal $RX_{IQ}$ at the frequency $-f_d-f_0$. The two further signals $RX_{IQ'}$ arise as a result of the converted spectral components of the signals $TX_{IQ}$ and $TX_{DC}$ at the image frequency. These are not required for calibration, however.

The frequency offset between the local oscillator signals of the transmission and reception paths means that the individual spectral components representing the error signals can be clearly distinguished from one another. Their amplitude can be ascertained independently of one another. The signal is also split into its inphase and quadrature components in the IQ demodulator, filtered, amplified and digitized in the analog/digital converters 37. The distortion unit 6 passes on the signal in undistorted form to the output 61 of the distortion unit 6 and supplies it to the input 111 of the digital measuring circuit.

This circuit comprises filtering, power estimation, which together with the control unit 7 forms a control loop. Following filtering and power estimation of the individual spectral components $TX_{DC}$, $TX_{IQ}$, $RX_{DC}$ and $RX_{IQ}$, the DC signal component is now calculated and is supplied as a parameter to the predistortion unit 5 and to the distortion unit 6. At the same time, distortion parameters for the amplitude and phase errors are transferred, which have been ascertained from the components $TX_{IQ}$ and $RX_{IQ}$.

A new test signal is then generated by the test signal generator 10 and is then distorted by the predistortion unit 5 in line with the parameters sent. Depending on the distortion, the signal distorted in this manner contains a DC component and an IQ mismatch. This is in the form such that the DC component through the transmission path and the IQ mismatch caused in the transmission path are compensated for. Following demodulation of the signal in the reception path and distortion by the unit 6 with the parameters obtained therein by the preceding measurement, the signal is gauged again.

The control loop comprising the measuring circuit and the control unit 7 corrects the compensators 5 and 6 such that the error signals brought about by the DC signal component and the amplitude and phase errors decrease in amplitude and, after a few iterations, have disappeared or been pushed below a particular threshold. When an optimum has been reached, the parameters are stored for the predistortion unit 5 and the distortion unit 6, and the switches 8 and 9 are connected to the output 1D or to the input 1A of the transceiver again. During the regular data transmission, which now follows, the predistortion unit 5 distorts the signals which are to be transmitted in line with the stored parameters, and the distortion unit 6 distorts the received signals converted in the reception path in line with its parameters.

As a result of the setting of the first and second local oscillator signals LO1 and LO2 by the calibration device 7, it is possible to perform calibration in the entire frequency range of baseband and therefore to avoid any external interference signals which are coupled in. If a frequency-selective amplitude and phase error IQ mismatch occurs in the reception path, it can be measured by serially tuning the frequency $f_0$ of the test signal and the differential frequency $f_d$ between LO1 and LO2 in the entire transmission band and can be corrected using a likewise frequency-selective compensator 6.

In this case, it is not necessary for two different variable local oscillators to be used, as in the exemplary embodiment shown. The local oscillator signal for the receiver may also be produced, for the calibration operation, by mixing the first local oscillator signal LO1 with an additional auxiliary signal at the frequency $f_d$. Since the auxiliary signal is in baseband, the test generator 10 may preferably likewise be used for production. In particular, it is possible to produce the auxiliary signal digitally and to supply it to an auxiliary mixer via a digital/analog converter.

The invention thus involves the use of two different frequencies for the transmission and reception paths, which means that individual spectral lines become visible in the transmission and reception paths on account of amplitude and phase errors or DC signal components.

While, for purposes of simplicity of explanation, the methodology of FIG. 3, below, is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 3:
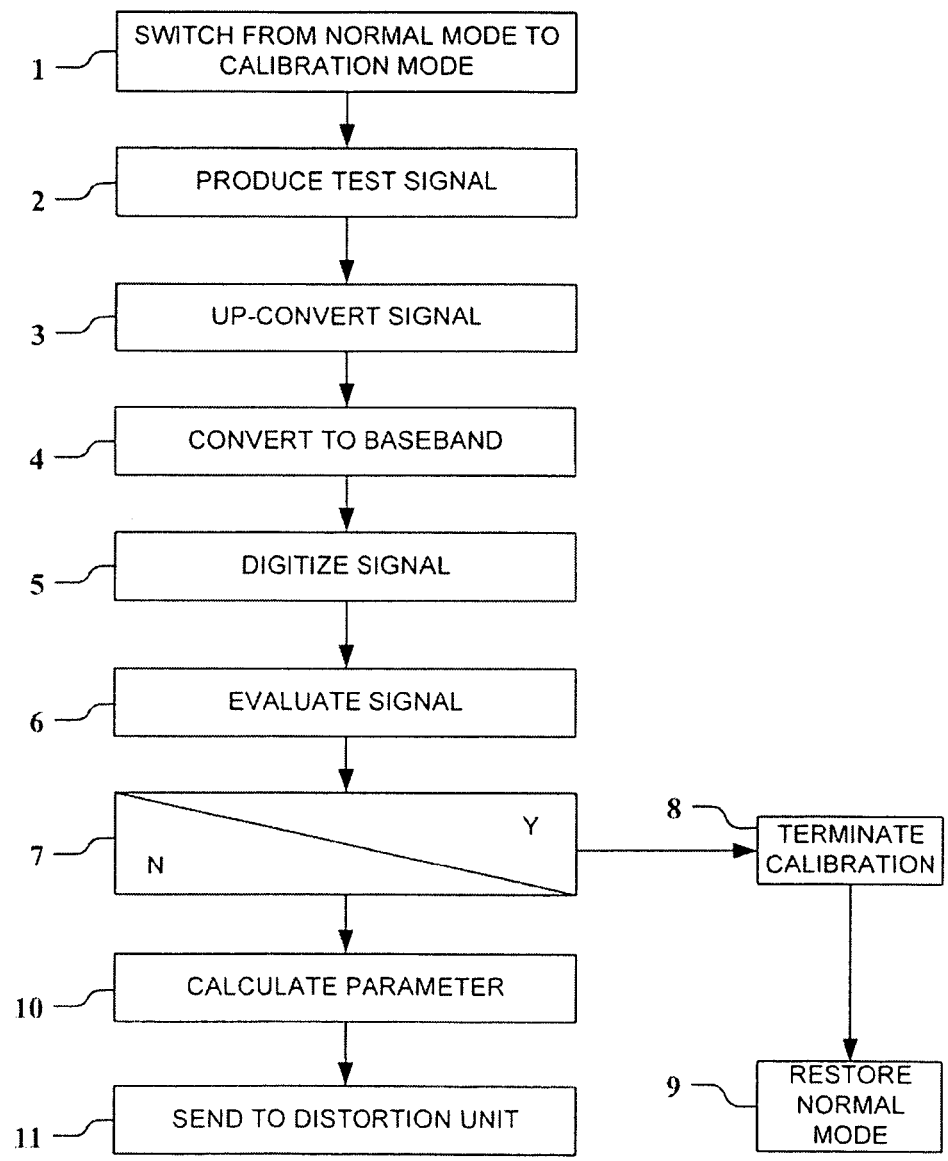
FIG. 3 is a flow diagram illustrating a method of operating a transmission/reception arrangement in accordance with an aspect of the present invention.

FIG. 3 is a flow diagram illustrating a method of operating a transmission/reception arrangement in accordance with an aspect of the present invention. In a first step 1, the calibration apparatus 7 switches the transmission and reception arrangement from a normal operating mode to a calibration mode. This involves not only separation of the normal baseband signal processing but also connection between the transmission and reception paths. In a second step, a test signal is produced. This signal may be a complex-value test signal, for example a cosinusoidal or sinusoidal signal using the two components I and Q. Alternatively, it is possible to use just one of the two components I or Q of the discrete-value signal.

The signal is supplied to the predistortion unit 5, which either predistorts it with parameters which are already available or forwards the signal unaltered to the input of the transmission path. It is then up-converted in step 3 using a local oscillator signal at a frequency which has been set beforehand by the control device 7.

When it has been returned with a variable attenuation in step 4, the test signal is converted to baseband again and digitized in the reception path 3 by a second local oscillator signal at a second frequency in step 5. The down converted digitized test signal is supplied to a distortion unit. Depending on the setting of the calibration apparatus, the distortion unit 6 forwards the test signal in undistorted form or predistorts it with parameters which have already been stored. Finally, the signal is supplied to the measuring apparatus 11 in step 6 and the measuring apparatus evaluates it and assesses the power of the individual spectral components.

If the power of the individual spectral components, viewed as a whole or individually, is below a particular threshold, then further optimization is not necessary. Calibration is terminated in steps 8 and 9 and the normal operating mode is restored.

Otherwise, calibration parameters are calculated in step 10 and these are sent to the distortion unit and to the predistortion unit in step 11. A test signal is then applied again, this signal now being distorted in line with the parameters sent and finally being evaluated again. The control is repeated until the minimum of the corresponding error signal power has been reached. For control purposes, algorithms which iteratively produce a minimum for the error signal power for each of the four error components separately by correcting the appropriate distortion unit are suitable. One known example thereof is the LMS algorithm.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

LIST OF REFERENCE SYMBOLS

1: Transmission/reception arrangement
2: Transmission path
3: Reception path
4: Switchable connection with attenuation element
5: Predistortion unit, compensation device
6: Distortion unit, compensation device
7: Calibration apparatus
8, 9: Switch
10: Test signal generator
11: Measuring apparatus
100: Baseband generator
200: Baseband receiver
1B: Transmission output
1C: Reception input
1A, 21, 32: Input
1D, 22, 31: Output
24, 34: Low-pass filter
23: Digital/analog converter
37: Analog/digital converter
26, 36: Local oscillators
25: IQ modulator
33: IQ demodulator, mixer
35: Amplifier
SI, SQ: Transmission signal components
EI, EQ: Received signal components
$f_0$: Test signal frequency
$f_C$: Transmitter carrier frequency
$TX_{DC}$, $TX_{IQ}$: Transmission error signals
$RX_{DC}$, $RX_{IQ}$: Reception error signals
$f_d$: Difference between reception and transmitter carrier frequency

What is claimed is:

1. A transmission/reception arrangement comprising:
a first input, a first output, a transmission output, and a reception input;
a transmission path having an input that receives a discrete-value transmission signal having a first component and a second component, wherein the transmission path converts the discrete-value transmission signal into an analog transmission signal and provides the analog transmission signal to the transmission output;
a reception path having an input that receives an analog reception signal from the reception input and an output that provides a discrete-value received signal, wherein the analog reception signal comprises a first component and a second component, wherein the reception path converts the analog reception signal into the discrete-value received signal;
a switchable connection between the output of the transmission path and the input of the reception path;
a first compensation device, connected upstream of the transmission path, having a control input and a signal input that receives the discrete-value transmission signal, wherein the first compensation device distorts the discrete-value transmission signal and provides it to the input of the transmission path;
a second compensation device, connected downstream of the reception path to the output of the reception path, having a control input and an output for the discrete-value received signal, wherein the second compensation device distorts the discrete-value received signal;
a first switching device, connected upstream of the first compensation device, to the input of the first compensation device wherein the first switching device adopts a first or second state, wherein the first state connects the input of the first compensation device to, the first input and the second state connects the input of the first compensation device to an output of a controllable generator circuit that generates a discrete-value test signal;
a second switching device, connected downstream of the second compensation device to the output of the second compensation device, wherein the second switching devices adopts a first or a second state, wherein the first state connects the output of the second compensation device to the first output, and the second state connects the output of the second compensation device to an input of a measuring apparatus, which generates an evaluation signal from a discrete-value calibration signal applied to the input to an output;
a calibration apparatus for controlling the first and second switching devices, the generator circuit and the first switchable connection, wherein the calibration apparatus has one input connected to the output of the measuring apparatus and ascertains distortion parameters on the basis of the evaluation signal received from the measuring apparatus;
wherein the transmission path further comprises a first mixing device having a local oscillator input for a first local oscillator signal at a first frequency and wherein the reception path further comprises a second mixing device having a local oscillator input for a second local oscillator signal at a second frequency; and
wherein the frequency of the first local oscillator signal and the frequency of the second local oscillator signal are set by the calibration device.

2. The transmission/reception arrangement of claim 1, wherein the second local oscillator signal is formed by a frequency conversion device from the first local oscillator signal and an auxiliary signal.

3. The transmission/reception arrangement of claim 1, wherein the switchable connection further comprises an attenuation element that attenuates a signal applied to the input of the switchable connection.

4. The transmission/reception arrangement of claim 1, wherein the first and second compensation devices further comprise a memory unit that stores parameters for altering the first and second components of the discrete-value transmission signal and of the discrete-value received signal.

5. The transmission/reception arrangement of claim 1, wherein the generator circuit produces test signals at various selected frequencies.

6. A method for reducing nonlinearities in output signals comprising:
providing a transmission/reception arrangement having a transmission path and a reception path;
applying a discrete-value test signal to an input on the transmission path;
deriving a frequency-converted analog transmission signal from the discrete-value test signal at an output on the transmission path;
returning the frequency-converted analog transmission signal to an input of the reception path;
deriving a frequency-converted discrete-value received signal from the returned frequency-converted analog transmission signal in the transmission path;
evaluating the frequency-converted discrete-value received signal in an evaluation device; and
providing calibration parameters for the transmission path and the reception path according to the evaluation;
wherein evaluating the frequency-converted discrete-value received signal comprises:
measuring a signal amplitude and a phase as a function of a signal frequency of the frequency-converted discrete-value received signal;
selecting a first signal component from at least two signal components;
suppressing un-selected signal components of the at least two signal components; and
measuring a power for the first signal component.

7. The method of claim 6, wherein deriving the frequency-converted analog transmission signal comprises:
converting the discrete-value test signal into an analog test signal; and
mixing the analog test signal with a first local oscillator signal at a first frequency.

8. The method of claim 7, wherein deriving the frequency-converted discrete-value received signal comprises:
mixing the returned frequency-converted analog transmission signal with a second local oscillator signal at a second frequency; and
converting the mixed signal into the frequency-converted discrete-value received signal.

9. The method of claim 6, wherein returning the frequency-converted analog transmission signal comprises attenuating a signal level of the frequency-converted analog transmission signal.

10. The method of claim 6, wherein providing calibration parameters comprises:
calculating distortion coefficients from at least one amplitude for the evaluated frequency-converted discrete-value received signal and at least one amplitude for the discrete-value test signal; and generating predistortion coefficients from the distortion coefficients.

11. A method for reducing nonlinearities in output signals comprising:
   providing a transmission/reception arrangement having a transmission path and a reception path;
   applying a discrete-value test signal to an input on the transmission path;
   deriving a frequency-converted analog transmission signal from the discrete-value test signal at an output on the transmission path;
   returning the frequency-converted analog transmission signal to an input of the reception path;
   deriving a frequency-converted discrete-value received signal from the returned frequency-converted analog transmission signal in the transmission path;
   evaluating the frequency-converted discrete-value received signal in an evaluation device; and
   providing calibration parameters for the transmission path and the reception path according to the evaluation;
   wherein evaluating the frequency-converted discrete-value received signal comprises measuring a signal amplitude and a phase as a function of a signal frequency of the frequency-converted discrete-value received signal;
   wherein providing calibration parameters comprises:
      calculating distortion coefficients from at least one amplitude for the evaluated frequency-converted discrete-value received signal and at least one amplitude for the discrete-value test signal; and
      generating predistortion coefficients from the distortion coefficients.

* * * * *